(12) United States Patent
Liao et al.

(10) Patent No.: US 9,698,229 B2
(45) Date of Patent: Jul. 4, 2017

(54) SEMICONDUCTOR STRUCTURE AND PROCESS THEREOF

(75) Inventors: Duan Quan Liao, Singapore (SG); Yikun Chen, Singapore (SG); Ching-Hwa Tey, Singapore (SG); Xiao Zhong Zhu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 299 days.

(21) Appl. No.: 13/351,231

(22) Filed: Jan. 17, 2012

(65) Prior Publication Data

US 2013/0181264 A1 Jul. 18, 2013

(51) Int. Cl.
*H01L 29/76* (2006.01)
*H01L 29/417* (2006.01)
*H01L 29/78* (2006.01)
*H01L 29/51* (2006.01)

(52) U.S. Cl.
CPC ...... *H01L 29/41791* (2013.01); *H01L 29/785* (2013.01); *H01L 29/7848* (2013.01); *H01L 29/517* (2013.01)

(58) Field of Classification Search
CPC ............... H01L 29/785; H01L 29/7848; H01L 29/41791
USPC ........................................................ 257/288
See application file for complete search history.

(56) References Cited

U.S. PATENT DOCUMENTS

| 5,998,873 | A |  | 12/1999 | Blair |
| 6,033,963 | A | * | 3/2000 | Huang .............. H01L 21/76838 257/368 |
| 6,043,138 | A |  | 3/2000 | Ibok |
| 6,492,216 | B1 |  | 12/2002 | Yeo |
| 6,566,212 | B1 | * | 5/2003 | Yu et al. ....................... 438/305 |
| 6,855,607 | B2 |  | 2/2005 | Achuthan |
| 6,921,963 | B2 |  | 7/2005 | Krivokapic |
| 7,013,446 | B2 |  | 3/2006 | Ohba |
| 7,087,477 | B2 |  | 8/2006 | Fried |
| 7,091,551 | B1 |  | 8/2006 | Anderson |
| 7,112,495 | B2 |  | 9/2006 | Ko |
| 7,214,620 | B2 |  | 5/2007 | Kim |
| 7,247,887 | B2 |  | 7/2007 | King |
| 7,250,658 | B2 |  | 7/2007 | Doris |
| 7,309,626 | B2 |  | 12/2007 | Ieong |
| 7,352,034 | B2 |  | 4/2008 | Booth, Jr. |

(Continued)

FOREIGN PATENT DOCUMENTS

KR 2006072827 A * 6/2006
TW 201104867 2/2011

*Primary Examiner* — Igwe U Anya
(74) *Attorney, Agent, or Firm* — Winston Hsu; Scott Margo

(57) ABSTRACT

A semiconductor structure includes at least a fin-shaped structure, a gate, a source/drain region, an interdielectric layer and an epitaxial structure. At least a fin-shaped structure is located on a bottom substrate. The gate covers the fin-shaped structure. The source/drain region is located in the fin-shaped structure next to the gate. The interdielectric layer covers the gate and the fin-shaped structure, wherein the interdielectric layer has a plurality of contact holes, respectively exposing at least a part of the source/drain region. The epitaxial structure is located in each of the contact holes, directly contacts and is only located on the source/drain region. Additionally, a semiconductor process formed said semiconductor structure is also provided.

4 Claims, 7 Drawing Sheets

(56) References Cited

U.S. PATENT DOCUMENTS

| | | |
|---|---|---|
| 7,470,570 B2 | 12/2008 | Beintner |
| 7,521,324 B2 | 4/2009 | Ohmi |
| 7,531,437 B2 | 5/2009 | Brask |
| 7,569,857 B2 | 8/2009 | Simon et al. |
| 7,592,270 B2 | 9/2009 | Teo |
| 7,723,174 B2* | 5/2010 | Waite et al. .................. 438/216 |
| 7,871,876 B2 | 1/2011 | Anderson |
| 8,343,872 B2* | 1/2013 | Sung et al. .................. 438/691 |
| 8,765,561 B2* | 7/2014 | Hung et al. .................. 438/308 |
| 2004/0195624 A1 | 10/2004 | Liu |
| 2005/0051825 A1 | 3/2005 | Fujiwara |
| 2005/0118757 A1* | 6/2005 | Cabral .............. H01L 21/82383 438/199 |
| 2006/0033166 A1* | 2/2006 | Park et al. .................... 257/368 |
| 2006/0099830 A1 | 5/2006 | Walther |
| 2006/0286729 A1 | 12/2006 | Kavalieros |
| 2007/0015365 A1 | 1/2007 | Chen |
| 2007/0072376 A1 | 3/2007 | Chen |
| 2007/0108528 A1 | 5/2007 | Anderson |
| 2007/0158756 A1 | 7/2007 | Dreeskornfeld |
| 2007/0164357 A1* | 7/2007 | Clevenger et al. ........... 257/347 |
| 2007/0218661 A1 | 9/2007 | Shroff |
| 2008/0054371 A1* | 3/2008 | Beyer et al. .................. 257/384 |
| 2008/0061366 A1 | 3/2008 | Liu |
| 2008/0116583 A1* | 5/2008 | Yuki ................ H01L 21/28525 257/774 |
| 2008/0157208 A1 | 7/2008 | Fischer |
| 2008/0166583 A1* | 7/2008 | Astrand ........................ 428/602 |
| 2009/0057759 A1 | 3/2009 | Obradovic |
| 2009/0124097 A1 | 5/2009 | Cheng |
| 2009/0200494 A1 | 8/2009 | Hatem |
| 2009/0242964 A1 | 10/2009 | Akil |
| 2009/0269916 A1 | 10/2009 | Kang |
| 2009/0310431 A1* | 12/2009 | Saito .............................. 365/207 |
| 2010/0040768 A1 | 2/2010 | Dhindsa |
| 2010/0044783 A1 | 2/2010 | Chuang |
| 2010/0048027 A1 | 2/2010 | Cheng |
| 2010/0059737 A1* | 3/2010 | Bhuwalka et al. ............. 257/28 |
| 2010/0072553 A1 | 3/2010 | Xu |
| 2010/0123198 A1* | 5/2010 | Kim .................. H01L 21/26506 257/377 |
| 2010/0129994 A1 | 5/2010 | Awad |
| 2010/0144121 A1 | 6/2010 | Chang |
| 2010/0167506 A1 | 7/2010 | Lin |
| 2011/0284966 A1* | 11/2011 | Wen et al. ..................... 257/368 |
| 2012/0025266 A1* | 2/2012 | Griebenow et al. ........... 257/190 |
| 2012/0104498 A1* | 5/2012 | Majumdar et al. ........... 257/351 |
| 2012/0112208 A1* | 5/2012 | Adam ................ H01L 21/28525 257/77 |
| 2012/0161238 A1* | 6/2012 | Scheiper et al. ............. 257/368 |
| 2012/0171826 A1* | 7/2012 | Kim et al. .................... 438/229 |
| 2012/0181630 A1* | 7/2012 | Ando ................ H01L 21/82384 257/410 |
| 2012/0241863 A1* | 9/2012 | Tsai et al. ..................... 257/347 |
| 2012/0267706 A1* | 10/2012 | Luo et al. ..................... 257/329 |
| 2012/0267725 A1* | 10/2012 | Zhu et al. ..................... 257/402 |
| 2012/0306026 A1* | 12/2012 | Guo .................. H01L 29/495 257/407 |
| 2012/0309158 A1* | 12/2012 | Hung .................. H01L 21/324 438/301 |
| 2013/0009257 A1* | 1/2013 | Ando ................ H01L 21/28088 257/411 |
| 2013/0020658 A1* | 1/2013 | Guo .................... H01L 29/4958 257/412 |
| 2013/0178039 A1* | 7/2013 | Ko ........................ H01L 21/02 438/382 |

\* cited by examiner

SEMICONDUCTOR STRUCTURE AND PROCESS THEREOF

BACKGROUND OF THE INVENTION

1. Field of the Invention

The present invention relates generally to a semiconductor structure and process thereof, and more specifically, to a semiconductor structure and process thereof, which directly forms an epitaxial structure in a contact hole.

2. Description of the Prior Art

Epitaxy technology is often used to form semiconductor components. The functions of the epitaxy technology are that not only can a whole single-crystalline silicon layer be formed but also problems caused in semiconductor processes can be solved. In addition, the epitaxy technology may also be used to form semiconductor components having particular functions. For instance, as a silicide process is performed, a metal layer will cover a source/drain region, so that metals in the metal layer will react with the silicon below. A silicide layer is thereby formed, which is used for electrically connecting the source/drain region (usually made of silicon or silicon compounds) below with the metal plug above as well as buffering the structural difference between both, thereby reducing sheet resistance. When silicon in the source/drain region over-reacts with the metal layer or the source/drain region is too shallow, however, the source/drain region will deplete after reacting, leading to a break down in the p-n junction. Thus, an improved method is provided, which forms an epitaxial layer before the metal layer is formed on the source/drain region. For example, epitaxial silicon or epitaxial silicon compounds can be paired with the silicon substrate. This means that the epitaxial layer located between the source/drain region and the metal layer can react with the metal layer without reducing the volume of the source/drain region.

For decades, chip manufacturers have made metal-oxide-semiconductor (MOS) transistors faster by making them smaller. As the semiconductor processes advance to the very deep sub-micron era such as 65-nm node or beyond, how to increase the driving current for MOS transistors has become a critical issue. In order to improve device performance, crystal strain technology has been developed. Crystal strain technology is becoming more and more attractive as a means for getting better performance in the field of MOS transistor fabrication. Forming an epitaxial layer on a source/drain region of a semiconductor crystal alters the speed at which charges move through the crystal. Strain makes MOS transistors work better by enabling electrical charges, such as electrons, to pass more easily through the silicon lattice of the gate channel.

As the size of a semiconductor component is scaled down, the method of forming the epitaxial layer on the source/drain region described above causes some negative effects. By using a fin-shaped field-effect transistor as an example, a source/drain region is formed in a fin-shaped structure, and an epitaxial structure covers the source/drain region. The epitaxial structure enlarges the volume of the fin-shaped structure, however, leading to a reduction of space between each fin-shaped structure. Even worse, this causes each adjacent fin-shaped structure to be merged together, giving rise to a short circuit of the semiconductor component. A way of preventing this short circuit is providing enough space between each fin-shaped structure; however, this would restrict the size of the semiconductor component and prevent the desired scaling down. The problem becomes particularly significant in a static random access memory (SRAM) having dense distribution of fin-shaped structures.

SUMMARY OF THE INVENTION

The present invention provides a semiconductor structure and process thereof, which forms an epitaxial structure in a contact hole to solve the above problem.

The present invention provides a semiconductor structure including at least a fin-shaped structure, a gate, a source/drain region, an interdielectric layer and an epitaxial structure. At least a fin-shaped structure is located on a bottom substrate. The gate covers the fin-shaped structure. The source/drain region is located in the fin-shaped structure next to the gate. The interdielectric layer covers the gate and the fin-shaped structure, wherein the interdielectric layer has a plurality of contact holes, respectively exposing at least a part of the source/drain region. The epitaxial structure is located in each of the contact holes, directly contacts and is only located on the source/drain region.

The present invention further provides a semiconductor process including the following steps. A substrate is provided. A MOS transistor is formed on the substrate, wherein the MOS transistor includes a gate located on the substrate and a source/drain region located in the substrate next to the gate. An interdielectric layer covering the substrate next to the gate is formed. A plurality of contact holes are formed in the interdielectric layer and expose at least a part of the source/drain region. An epitaxial structure is respectively formed in each of these contact holes, directly contacts and is only located on the source/drain region. A silicide is formed on the epitaxial structure in each of these contact holes. A dielectric layer is deposited on the interdielectric layer and covers the gate. A plurality of corresponding contact holes is formed in the dielectric layer for connecting these contact holes. A metal material is respectively filled into each of these contact holes, their corresponding contact holes and on the silicide.

The present invention provides a semiconductor process including the following steps. A substrate is provided. A MOS transistor is formed on the substrate, wherein the MOS transistor includes a gate located on the substrate and a source/drain region located in the substrate next to the gate. An interdielectric layer and a dielectric layer covering the substrate next to the gate are sequentially formed. A plurality of contact holes is formed in the interdielectric layer and in the dielectric layer to expose at least a part of the source/drain region. An epitaxial structure is respectively formed in each of these contact holes. A silicide is respectively formed on the epitaxial structure in each of these contact holes. A metal material is respectively filled into these contact holes and on the silicide.

According to the above, the present invention provides a semiconductor structure and process thereof, which can control the growth area of the epitaxial structure by forming the epitaxial structure in these contact holes. For example, the size and the shape of the epitaxial structure can be controlled effectively. Therefore, the adjacent epitaxial structures will not merge together, which prevents short circuiting of a semiconductor component formed by the present invention. Also, the size of the semiconductor component can be scaled down by refining the layout of the semiconductor component.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
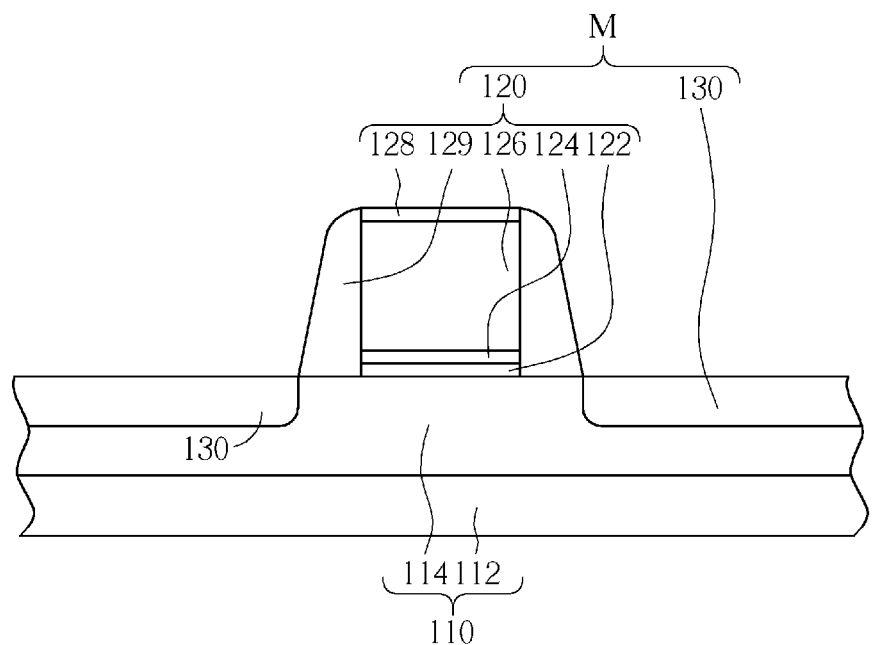
FIGS. 1-7 schematically depict a cross-sectional view of a semiconductor process according to the first embodiment of the present invention.

FIGS. 1-7 schematically depict a cross-sectional view of a semiconductor process according to the first embodiment of the present invention. As shown in FIG. 1, a MOS transistor M is formed on a substrate 110. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The semiconductor processes depicted in FIGS. 1-7 and also in FIG. 8-11 may be fin-shaped field-effect transistor processes. Therefore, the substrate 110 is a bulk substrate and the substrate 110 includes a bottom substrate 112 and at least a fin-shaped structure 114 on the bottom substrate 112. The semiconductor processes may also be planar transistor processes in other embodiments, however. Because the cross-sectional views of a fin-shaped field-effect transistor and a planar transistor are the same, and the present invention can be applied to both structures, FIGS. 1-7 and FIGS. 8-11 can represent the fin-shaped field-effect transistor and the planar transistor as well. For clarifying the features of the present invention, fin-shaped field-effect transistor processes are described below, but the present invention is not restricted to be applied to this. The present invention can also be applied to semiconductor processes such as various planar transistor processes and non-planar transistor processes.

Please refer to FIG. 1 again. The method of forming the fin-shaped structure 114 on the bottom substrate 112 may be: a bulk bottom substrate (not shown) is provided. A hard mask layer (not shown) is formed on the bulk bottom substrate (not shown) and is patterned to define the location of the fin-shaped structure 114, which will be formed in the bulk bottom substrate (not shown). An etching process is performed to form the fin-shaped structure 114 in the bulk bottom substrate (not shown). Thus, the fin-shaped structure 114 located on the bottom substrate 112 is formed completely. In one embodiment, the hard mask layer (not shown) is removed after the fin-shaped structure 114 is formed, and a tri-gate MOSFET can be formed in the following processes. There are three contact faces between the fin structure 120 and the following formed dielectric layer functioning as a carrier channel whose width is wider than a channel width in a conventional planar MOSFET. When a driving voltage is applied, the tri-gate MOSFET produces a double on-current comparing to the conventional planar MOSFET. In another embodiment, the hard mask layer (not shown) is reserved to form a fin field effect transistor (Fin FET), which is another kind of multi-gate MOSFET. Due to the hard mask layer (not shown) being reserved in the fin field effect transistor, there are only two contact faces between the fin structure 114 and the following formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning the fin-shaped structure formed on the silicon-on-insulator substrate (not shown) is finished.

For clarifying the present invention, one fin-shaped structure 114 is depicted in this embodiment, but the present invention can also be applied to a plurality of fin-shaped structures 114.

A gate 120 covers the fin-shaped structure 114. The method of forming the gate 120 may include: a buffer layer (not shown), a gate dielectric layer (not shown), an electrode layer (not shown) and a cap layer (not shown) are sequentially formed and all are patterned, thereby a buffer layer 122 is formed on the fin-shaped structure 114, a gate dielectric layer 124 is formed on the buffer layer 122, an electrode layer 126 is formed on the gate dielectric layer 124 and a cap layer 128 is formed on the electrode layer 126. A spacer 129 is formed next to the buffer layer 122, the gate dielectric layer 124, the electrode layer 126 and the cap layer 128. Therefore, the manufacturing of the gate 120 is finished. Then, a source/drain region 130 is formed in the fin-shaped structure 114 next to the gate 120 by methods such as ion implantation process. The gate 120 and the source/drain region 130 constitute the MOS transistor M.

The buffer layer 122 may be a silicon dioxide layer; the gate dielectric layer 124 may be an oxide layer, a dielectric layer having a high dielectric constant, etc. The material of the dielectric layer having a high dielectric constant may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_1-xO_3$, PZT) and barium strontium titanate ($Ba_xSr_1-xTiO_3$, BST); the electrode layer 126 may be a polysilicon layer; the cap layer 128 and the spacer 129 may be composed of silicon nitride, but are not limited thereto. In this embodiment, a gate last for high-K last process is applied, so that the gate dielectric layer 124 is a dielectric layer such as an oxide layer. Due to the electrode layer 126 being a polysilicon layer in this embodiment, the gate 120 is a polysilicon gate. In another embodiment, a gate Last for high-K first process, a gate first process, or a polysilicon gate process, etc. may be applied.

Figure 2:
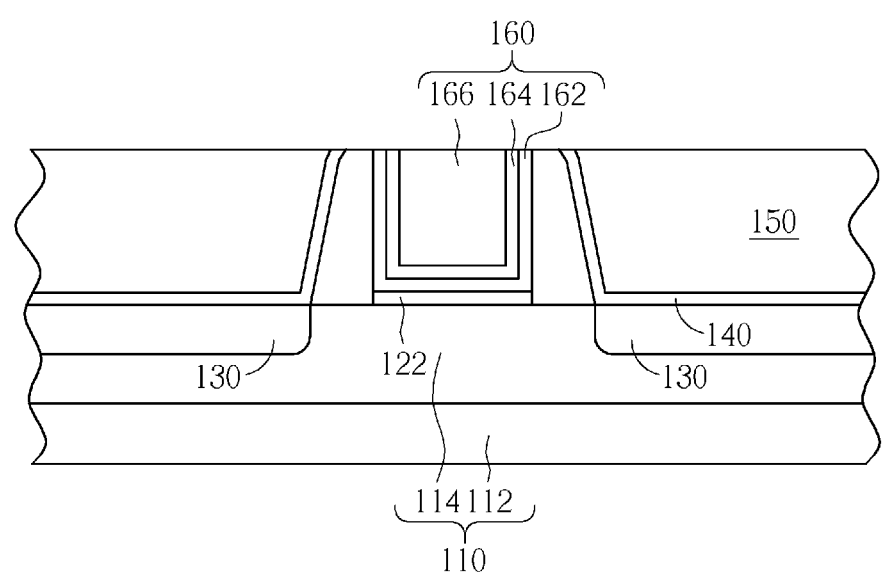

As shown in FIG. 2, a contact etch stop layer 140 may be selectively formed and covers the gate 120 and the substrate 110. A planarized interdielectric layer 150 is formed to cover the substrate 110 next to the gate 120. In this embodiment, the gate 120 may be a polysilicon gate or a sacrificial gate, which would be replaced with a metal gate 160 by a replacement gate process. An interdielectric layer (not shown) is formed and covers the gate 120 and the substrate 110. The interdielectric layer (not shown) may be polished by processes such as a chemical mechanical polishing process to form a planarized interdielectric layer 150 covering the substrate 110 next to the gate 120, wherein the cap layer 128 may be removed as the interdielectric layer (not shown) is polished to expose the electrode layer 126 below the cap layer 128. The electrode layer 126 and the gate dielectric layer 124 may be sequentially removed and a dielectric layer having a high dielectric constant 162, a bottom barrier layer (not shown), a work function metal layer 164, a top barrier layer (not shown) and a low resistivity material 166 may be sequentially filled to form a metal gate 160. The low resistivity material 166 may be composed of metals such as copper, aluminum or tungsten etc.

Figure 3:
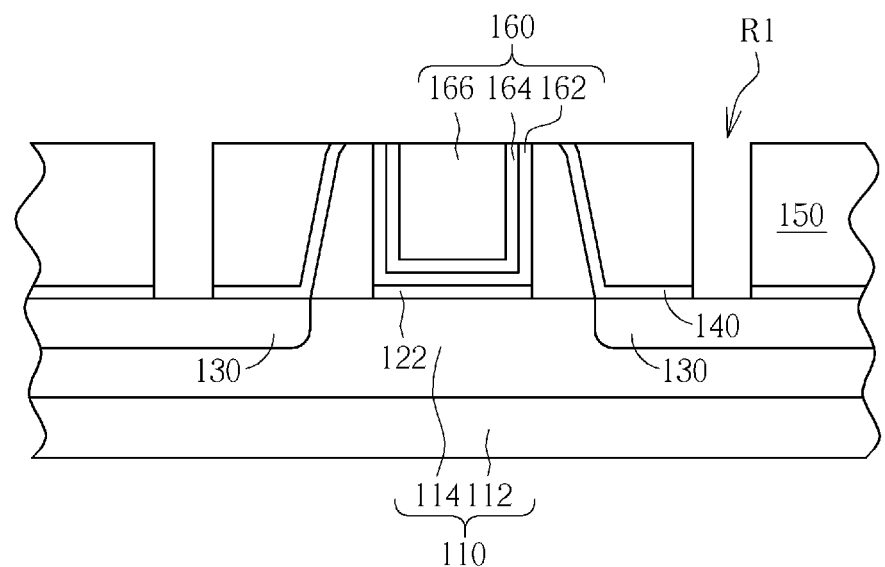
Figure 4:
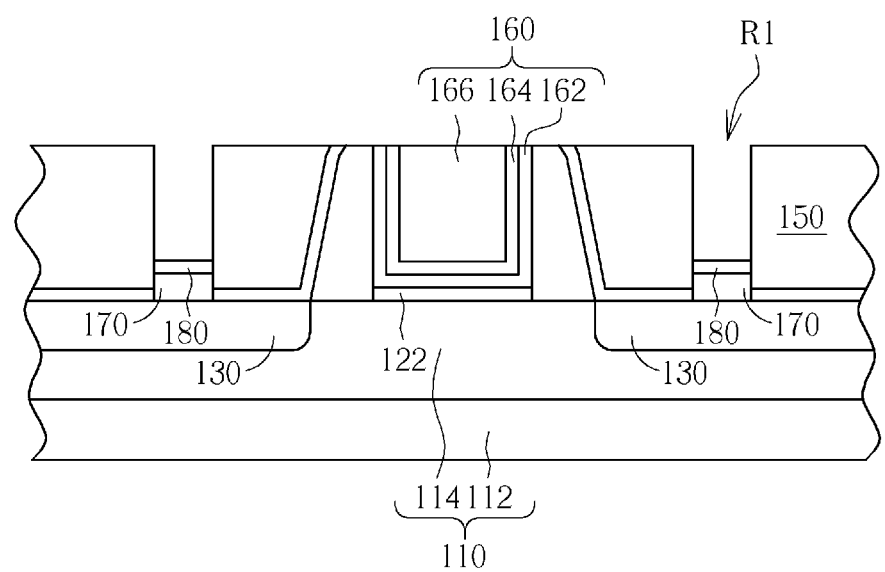

As shown in FIG. 3, a plurality of contact holes R1 are formed in the interdielectric layer 150 by processes such as an etching process, and then at least a part of the source/drain region 130 is exposed. As shown in FIG. 4, an epitaxial structure 170 is respectively formed in each of these contact holes R1. As shown in the figure, the epitaxial structure 170 is in each of these contact hole R1, directly contacts and is located on apart of the source/drain region 130. In this embodiment, the epitaxial structure 170 does not fill up the contact holes R1, but in anther embodiment, the epitaxial structure 170 may be fill up the contact holes R1. The epitaxial structure 170 may include an epitaxial strained silicon layer such as an epitaxial silicon germanium layer suited for use in a PMOS transistor or an epitaxial silicon carbide layer suited for use in an NMOS transistor, or an epitaxial silicon layer, which may just be a raised source/drain region suited for being a part of silicide, used in a transistor which does not need stress to be forced through it.

Please refer to FIG. 4 again. A silicide 180 is formed on the epitaxial structure 170 in each of these contact hole R1. More precisely, a metal layer (not shown) is formed on the epitaxial structure 170. A thermal treatment may be performed to diffuse metals in the metal layer (not shown) to part of the epitaxial structure 170, so that the silicide 180 is formed. The metal layer (not shown) may be made of nickel, cobalt, or titanium, etc. In a preferred embodiment, the epitaxial structure 170 remains between the source/drain region 130 and the silicide 180 after the silicide 180 is formed.

Figure 5:
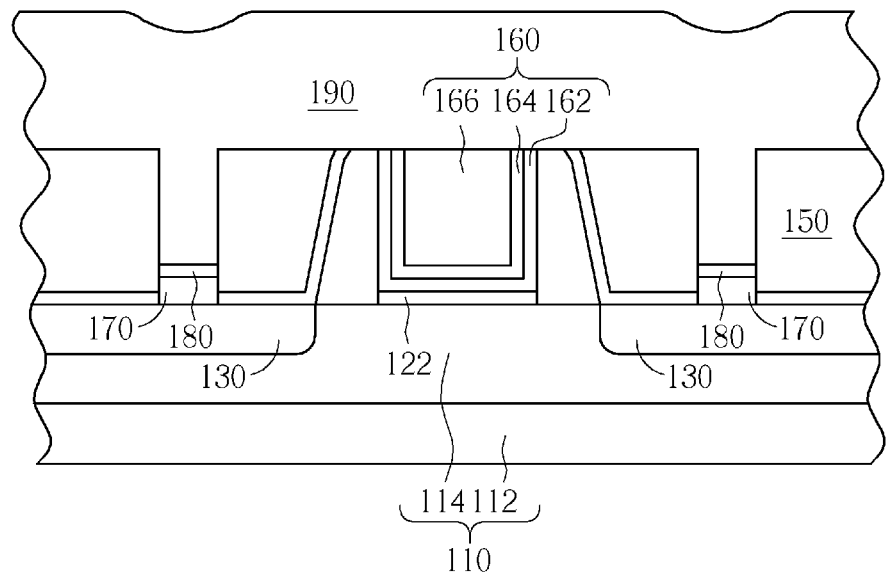

As shown in FIG. 5, a dielectric layer 190 is deposited on the interdielectric layer 150 and covers the metal gate 160. The material of the dielectric layer 190 is preferably the same as the interdielectric layer 150. That is, the dielectric layer 190 is the extension of the interdielectric layer 150.

Figure 6:
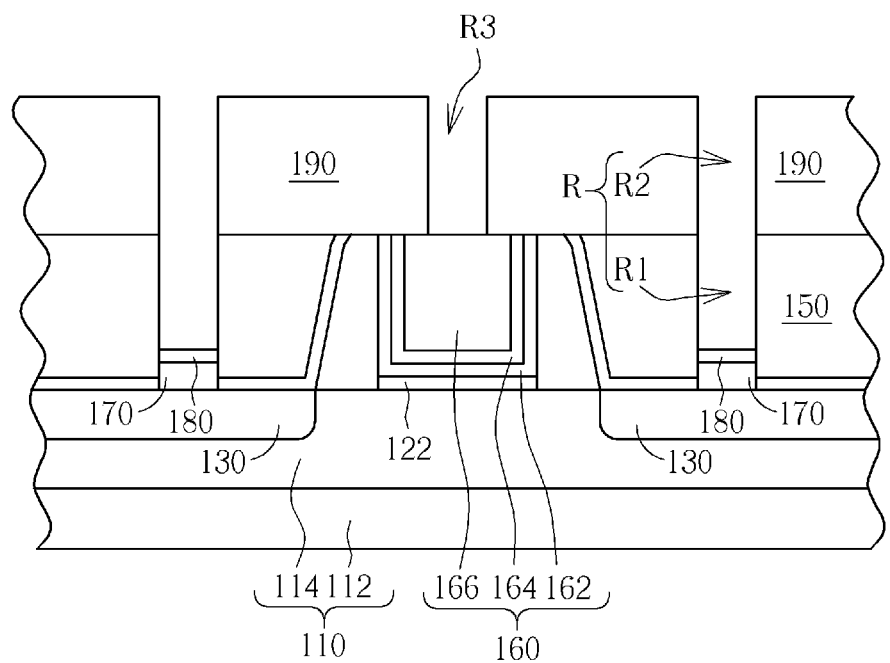

As shown in FIG. 6, a plurality of corresponding contact holes R2 are formed in the dielectric layer 190 for connecting these contact holes R1. In this embodiment, these corresponding contact hole R2 are aligned to contact holes R1, so that corresponding contact hole R2 and contact holes R1 constitute contact holes R. Furthermore, a gate contact hole R3 is also formed right above the metal gate 160 and exposes at least a part of the metal gate 160 while the corresponding contact hole R2 are formed.

Figure 7:
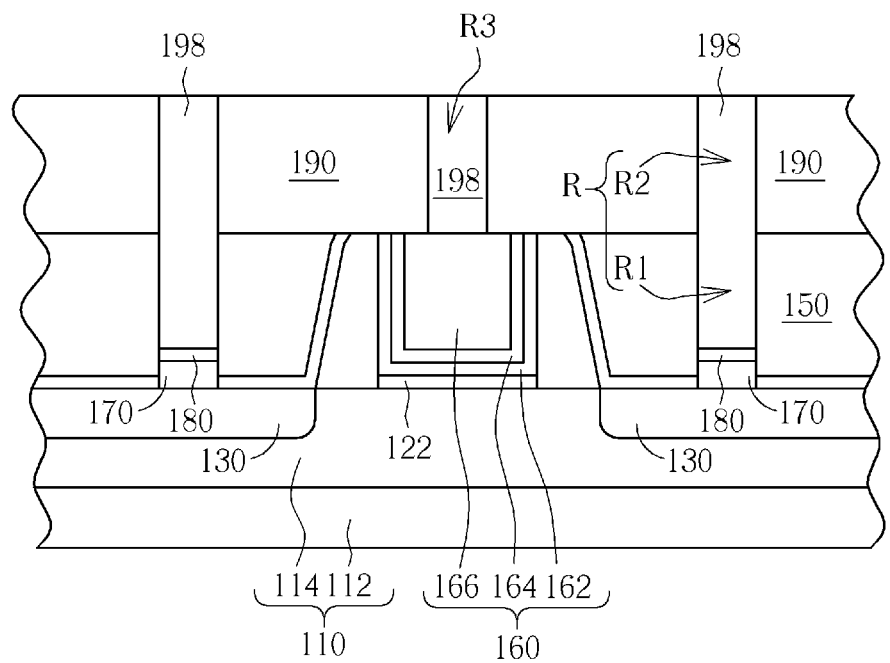

As shown in FIG. 7, a metal material 198 is filled into contact holes R and the gate contact hole R3, and is then planarized, meaning the semiconductor process is finished. The metal material 198 may include barrier layers (not shown) made of titanium (Ti), tantalum (Ta), tantalum nitride (TaN) or etc and metals made of tungsten (W), copper (Cu), or aluminum (Al), etc.

Figure 8:
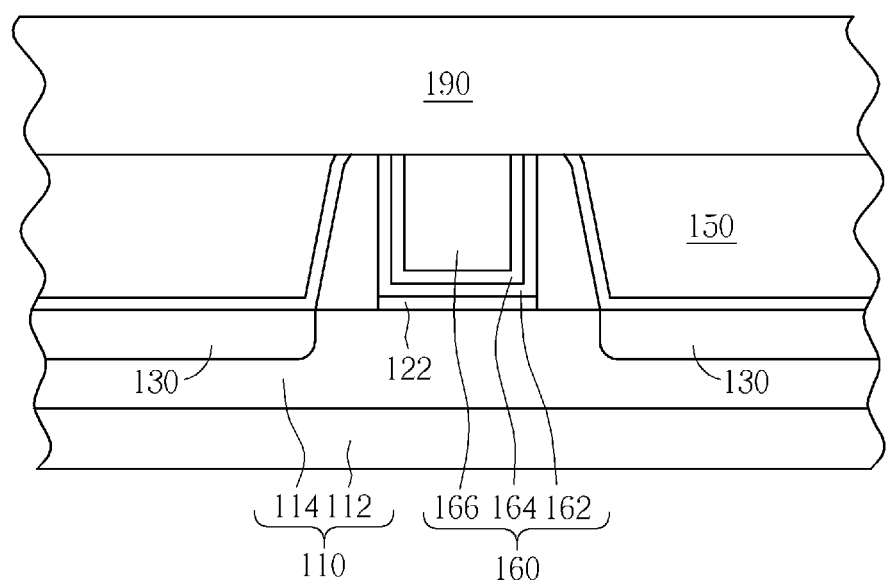
FIGS. 8-10 schematically depict a cross-sectional view of a semiconductor process according to the second embodiment of the present invention.
Figure 9:
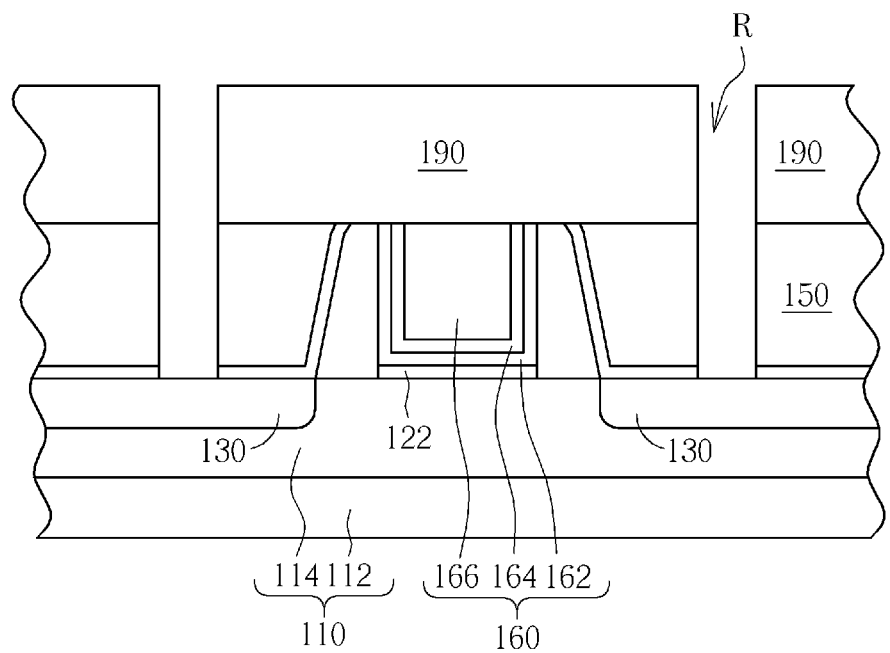
Figure 10:
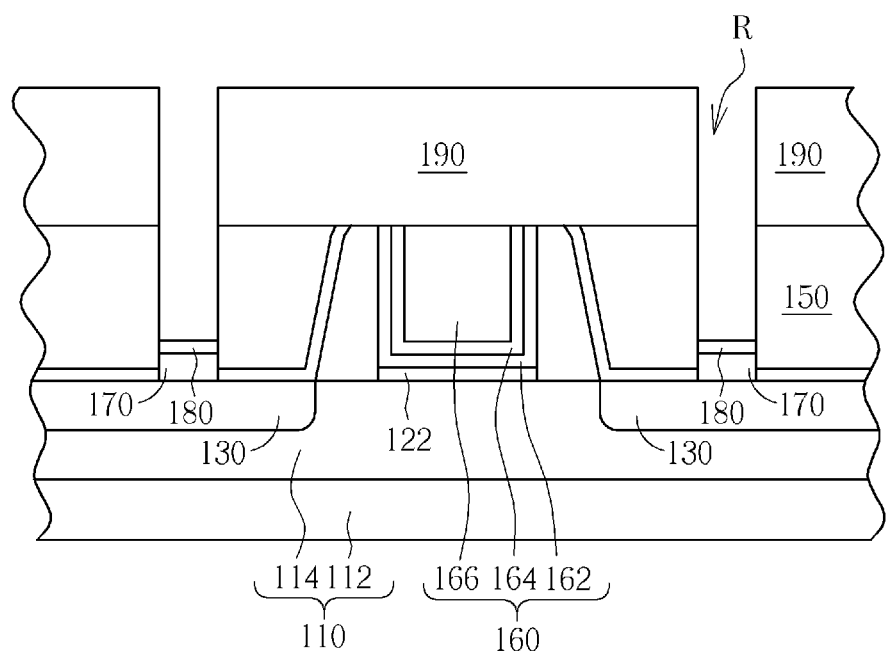

FIGS. 8-10 schematically depict a cross-sectional view of a semiconductor process according to the second embodiment of the present invention. After the interdielectric layer 150 covering the substrate 110 next to the gate 120 and the metal gate 160 is formed (as shown in FIGS. 1-2), the dielectric layer 190 is formed on the interdielectric layer 150 and covers the metal gate 160 (as shown in FIG. 8). As in the first embodiment, the substrate 110 may be a semiconductor substrate such as a bulk substrate or a silicon-on-insulator (SOI) substrate and the substrate 110 may include at least a fin-shaped structure on a bottom substrate. The semiconductor process of the second embodiment can be applied to a planar transistor process or a non-planar transistor process etc.

As shown in FIG. 9, a plurality of contact holes R are formed in the interdielectric layer 150 and the dielectric layer 190 by processes such as a photolithography process to expose at least a part of the source/drain region 130. As shown in FIG. 10, the epitaxial structure 170 may be respectively formed in each of these contact holes R, wherein the epitaxial structure 170 is located in each of these contact holes R, directly contacts and is located on the part of the source/drain region 130. In this embodiment, the epitaxial structure 170 does not fill up the contact holes R, but in anther embodiment, the epitaxial structure 170 may be fill up the contact holes R. The epitaxial structure 170 may include an epitaxial strained silicon layer such as an epitaxial silicon germanium layer suited for use in a PMOS transistor or an epitaxial silicon carbide layer suited for use in an NMOS transistor, or an epitaxial silicon layer, which may just be a raised source/drain region suited for being a part of silicide, used in a transistor which does not need stresses forced through it. The silicide 180 is formed on the epitaxial structure 170 in each of the contact holes R. More specifically, a metal layer (not shown) is formed on the epitaxial structure 170. A thermal treatment may be performed to diffuse metals in the metal layer (not shown) to part of the epitaxial structure 170, so that the silicide 180 is formed. The metal layer (not shown) may be made of nickel, cobalt, or titanium, etc. Then, the gate contact hole (not shown) may be formed by a photolithography process. A metal material (not shown) may be respectively filled into the contact holes R and the gate contact hole (not shown) and be planarized, at which point the semiconductor process of the second embodiment of the present invention is finished. The metal material (not shown) may include barrier layers (not shown) made of titanium (Ti), tantalum (Ta), or tantalum nitride (TaN) etc. and metals made of tungsten (W), copper (Cu), or aluminum (Al), etc.

Otherwise, the plurality of contact holes R and the gate contact hole (not shown) may be formed in the interdielectric layer 150 and the dielectric layer 190 at the same time by processes such as a photolithography process to expose at least apart of the source/drain region 130 and the low resistivity material 166. Then, the epitaxial structure 170 may be respectively formed in each of these contact holes R. Due to the low resistivity material 166 being metals, the epitaxial structure 170 will not formed thereon. The metal material (not shown) may be respectively filled into the contact holes R and the gate contact hole (not shown) and be planarized, at which point the semiconductor process of the present invention is finished.

Figure 11:
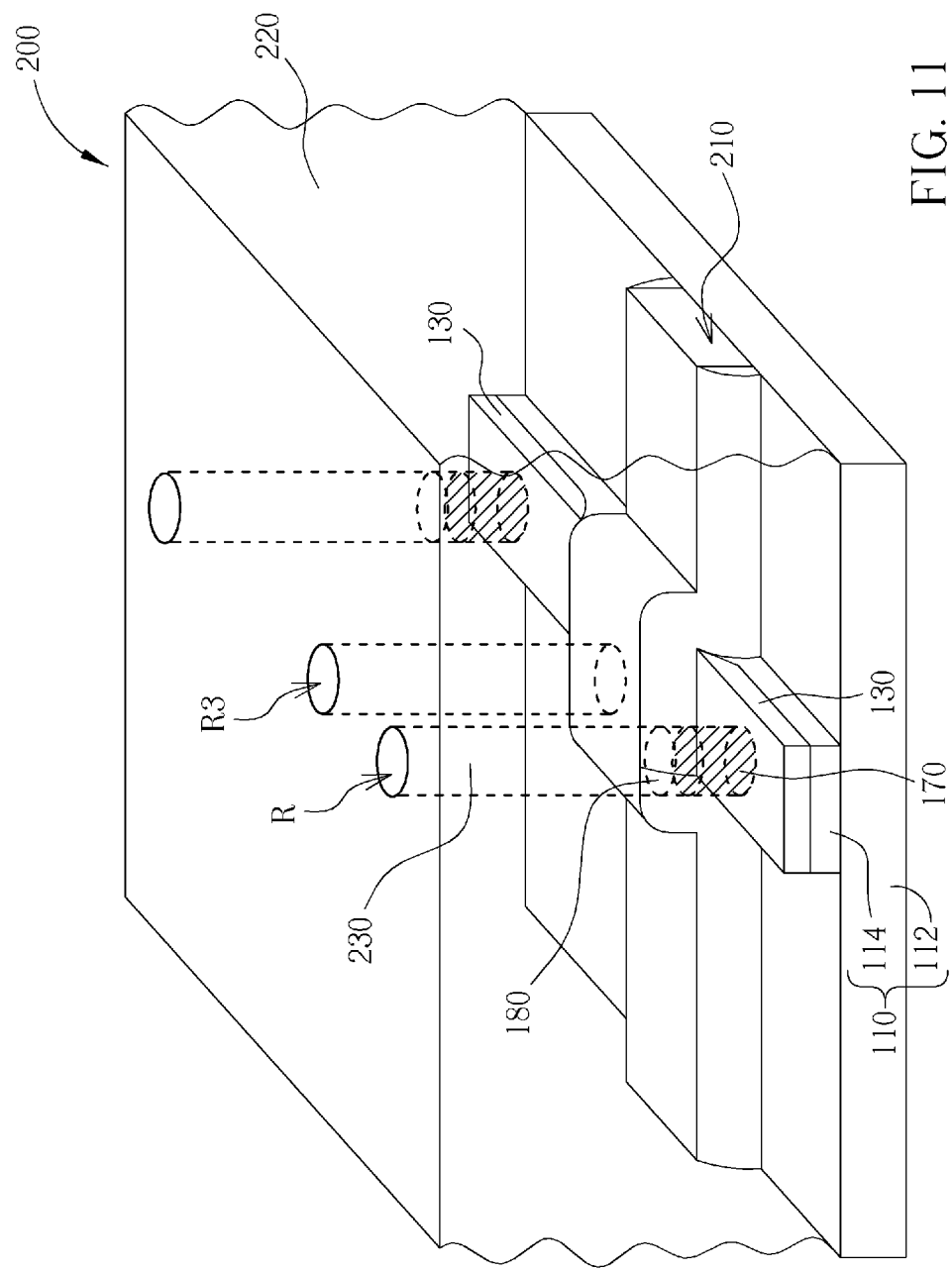
FIG. 11 schematically depicts a cross-sectional view of a semiconductor structure according to one embodiment of the present invention.

A semiconductor structure can be formed by the first embodiment or by the second embodiment. FIG. 11 schematically depicts a cross-sectional view of a semiconductor structure according to one embodiment of the present invention. A semiconductor structure 200 includes a fin-shaped structure 114, agate 210, a source/drain region 130, an interdielectric layer 220 and an epitaxial structure 170. The fin-shaped structure 114 is located on the bottom substrate 112. The gate 120 covers the fin-shaped structure 114. The source/drain region 130 is located in the fin-shaped structure 114 next to the gate 120. The interdielectric layer 220 including the interdielectric layer 150 and the dielectric layer 190 in the first embodiment or in the second embodiment covers the gate 210 and the fin-shaped structure 114. A contact etch stop layer (not shown) may be selectively located between the interdielectric layer 220 and the fin-shaped structure 114. The interdielectric layer 220 has a plurality of contact holes R and a gate contact hole R3, respectively exposing at least a part of the source/drain region 130 and at least a part of the gate 210. The epitaxial structure 170 is located in each of these contact holes R, directly contacts and is located on the source/drain region 130. A silicide 180 is located on the epitaxial structure 170 in each of the contact holes R. A metal plug 230 is located on the silicide 180 in each of the contact holes R and in the gate contact hole R3. The materials of the fin-shaped structure 114 and the bottom substrate 112 may be the same, such as silicon, and both constitute the substrate 110. The gate 210 may be a polysilicon gate or a sacrificial gate, which may be replaced with a metal gate after a part of the interdielectric layer 220 (corresponding to the interdielectric layer 150 of the first embodiment and the second embodiment) is formed. The epitaxial structure 170 may include an epitaxial strained silicon layer or an epitaxial silicon layer etc. The metal plug 230 may be made of metals such as copper or aluminum, etc.

Above all, in the semiconductor processes of the first embodiment and the second embodiment, the epitaxial structure 170 are all formed in each of the contact holes R after the contact hole R are formed. Thus, the epitaxial structure 170 is restricted to be formed in the contact holes R. In this way, the growth area of the epitaxial structure 170 can be controlled, and thereby the epitaxial structure 170 on the fin-shaped structure 114 can be prevented from merging together. The size of the semiconductor structure 200 can also be scaled down by controlling the size and the shape of the epitaxial structure 170.

Figure 12:
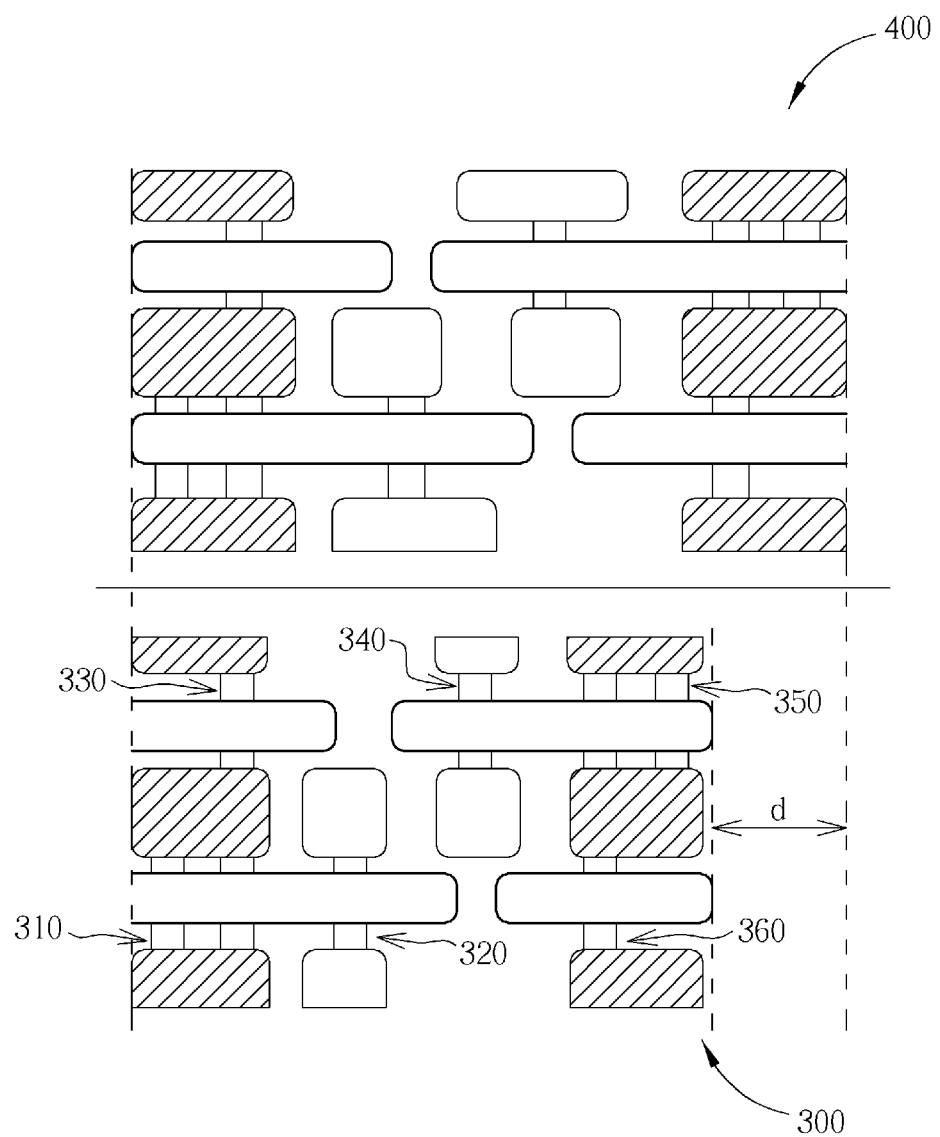
FIG. 12 schematically depicts a layout diagram of a static random access memory (SRAM) according to one embodiment of the present invention and prior art.

The semiconductor structure formed by the semiconductor processes of the first embodiment and the second embodiment can also be applied to various semiconductor devices. For example, the semiconductor structure can be applied to a static random access memory (SRAM). As the numbers of the MOS transistor of the semiconductor structure 200 are more than one, MOS transistors can be distributed to form a static random access memory (SRAM). FIG. 12 schematically depicts a layout diagram of a static random access memory (SRAM) according to one embodiment of the present invention and prior art, wherein the top part of FIG. 12 schematically depicts a layout diagram of a static random access memory (SRAM) according to the prior art and the bottom part of FIG. 12 schematically depicts a layout diagram of a static random access memory (SRAM) according to one embodiment of the present invention. As shown in the bottom part of FIG. 12, a static random access memory (SRAM) 300 formed by the semiconductor structure 200 of the present invention includes two double fin-shaped structures 310 and 350 and four single fin-shaped structures 320, 330, 340 and 360. As the size of the static random access memory (SRAM) 300 is scaled down, the adjacent fin-shaped structures of the double fin-shaped structures 310 and 350 having an epitaxial structure thereon are easier to be merged together than the single fin-shaped structures 320, 330, 340 and 360 because the fin-shaped structures of the double fin-shaped structures 310 and 350 are distributed more densely than the fin-shaped structures of the single fin-shaped structures 320, 330, 340 and 360, thereby causing the static random access memory (SRAM) 300 to shut down. By applying the present invention, each epitaxial structure (not shown) on the fin-shaped structures 310 and 350 can be prevented from merging together by restricting each epitaxial structure (not shown) to be formed only in the contact holes (not shown), thereby preventing the static random access memory (SRAM) 300 from short circuiting. Furthermore, comparing the static random access memory (SRAM) 300 applying the semiconductor process of the present invention (as shown in the bottom part of FIG. 12) with the static random access memory (SRAM) 400 of the prior art (as shown in the top part of FIG. 12), the size of the static random access memory (SRAM) 300 can be smaller than the size of the static random access memory (SRAM) 400. For example, the length of the static random access memory (SRAM) 300 can be shrunk by a distance d compared to the length of the static random access memory (SRAM) 400.

According to the above, the present invention provides a semiconductor structure and process thereof, which controls the growth area of an epitaxial structure by forming the epitaxial structure in each of the contact holes. Thus, the size and the shape of the epitaxial structure can be controlled. For example, in the process forming the semiconductor structure of the present invention, contact holes are formed and then an epitaxial layer is filled into each of the contact holes. More precisely, the method of forming these contact holes may include two steps: bottom contact holes are formed and the epitaxial layer and a silicide are filled into each of the bottom contact holes; then, top contact holes and a gate contact hole are formed. The method of forming these contact holes may also comprise one step only: the contact holes are formed at once; then an epitaxial layer, a silicide and a metal plug etc are sequentially formed into each of the contact holes.

Therefore, the growth area of the epitaxial structure in each of the contact holes can be controlled by applying the feature of the present invention, so each adjacent epitaxial structure can be prevented from merging together, which causes short circuits in a semiconductor component formed according to the prior art. Moreover, layout in the semiconductor component can be refined by the well-controlled growth area of epitaxial structures. As a result, the size of the semiconductor component can be scaled down.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   at least a fin-shaped structure located on a bottom substrate;
   a gate covering the fin-shaped structure;
   a source/drain region located in the fin-shaped structure next to the gate;
   an interdielectric layer covering the gate and the fin-shaped structure, wherein the interdielectric layer has a plurality of contact holes, respectively exposing at least a part of the source/drain region;
   an epitaxial structure only located in each of the contact holes, directly contacting and only located on the source/drain region, wherein the band gap of the epitaxial structure is smaller than the band gap of the source/drain region;
   a silicide located on the epitaxial structure in each of the contact holes, wherein the epitaxial structure in each of the contact holes is located between the silicide and the source/drain region;

a metal plug located on the silicide in each of the contact holes; and a dielectric layer covering the interdielectric layer and the gate, wherein a top surface of the gate is on a same level as a top surface of the interdielectric layer and the dielectric layer has a gate contact hole exposing at least a part of the gate.

2. The semiconductor structure according to claim 1, wherein the gate comprises a polysilicon gate or a metal gate.

3. The semiconductor structure according to claim 1, further comprising a contact etch stop layer located between the interdielectric layer and the fin-shaped structure.

4. The semiconductor structure according to claim 1, wherein the epitaxial structure comprises a strained epitaxial silicon.

* * * * *